United States Patent
Kotra et al.

(10) Patent No.: US 11,556,250 B2
(45) Date of Patent: Jan. 17, 2023

(54) METHOD AND APPARATUS FOR TEMPERATURE-GRADIENT AWARE DATA-PLACEMENT FOR 3D STACKED DRAMS

(71) Applicant: ADVANCED MICRO DEVICES, INC., Santa Clara, CA (US)

(72) Inventors: Jagadish B. Kotra, Austin, TX (US); Karthik Rao, Austin, TX (US); Joseph L. Greathouse, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/939,814

(22) Filed: Jul. 27, 2020

(65) Prior Publication Data

US 2021/0034256 A1    Feb. 4, 2021

Related U.S. Application Data

(63) Continuation of application No. 16/052,055, filed on Aug. 1, 2018, now Pat. No. 10,725,670.

(51) Int. Cl.
*G06F 3/06* (2006.01)

(52) U.S. Cl.
CPC .......... *G06F 3/0619* (2013.01); *G06F 3/0634* (2013.01); *G06F 3/0647* (2013.01); *G06F 3/0673* (2013.01)

(58) Field of Classification Search
CPC .... G06F 3/0619; G06F 3/0673; G06F 3/0647; G06F 3/0634; G11C 11/40626; G11C 5/025; G11C 7/04

See application file for complete search history.

(56) References Cited

U.S. PATENT DOCUMENTS

| | | | |
|---|---|---|---|
| 6,016,529 A * | 1/2000 | Woodman | G06F 12/0864 707/999.1 |
| 10,725,670 B2 * | 7/2020 | Kotra | G11C 11/40626 |
| 2013/0275665 A1 * | 10/2013 | Saraswat | G06F 12/00 711/106 |
| 2014/0281366 A1 * | 9/2014 | Felch | G06F 9/355 711/207 |
| 2017/0201422 A1 * | 7/2017 | LaBrie | H04L 67/1097 |
| 2019/0354472 A1 * | 11/2019 | Jacob | G06F 12/0862 |

* cited by examiner

*Primary Examiner* — Sultana Begum

(57) ABSTRACT

A system including a stack of two or more layers of volatile memory, such as layers of a 3D stacked DRAM memory, places data in the stack based on a temperature or a refresh rate. When a threshold is exceeded, data are moved from a first region to a second region in the stack, the second region having one or both of a second temperature lower than a first temperature of the first region or a second refresh rate lower than a first refresh rate of the first region.

21 Claims, 4 Drawing Sheets

METHOD AND APPARATUS FOR TEMPERATURE-GRADIENT AWARE DATA-PLACEMENT FOR 3D STACKED DRAMS

CROSS-REFERENCE TO RELATED APPLICATIONS

The present application is a continuation application of U.S. patent application Ser. No. 16/052,055, entitled "A METHOD AND APPARATUS FOR TEMPERATURE-GRADIENT AWARE DATA-PLACEMENT FOR 3D STACKED DRAMS", and filed on Aug. 1, 2018, the entirety of which is incorporated by reference herein.

BACKGROUND

To maintain data integrity memory in dynamic random access memory (DRAM), DRAM cells are refreshed periodically. A retention time of DRAM cells is a function of operating temperature and random manufacturing variations. As temperature increases, the DRAM cells discharge more rapidly thereby reducing the amount of time data are retained in those cells. As a result, to reliably maintain data, thermally hotter DRAM cells need to be refreshed more often than colder DRAM cells. While the required refresh time of a DRAM cell is partly a function of temperature, manufacturing variations exist between each DRAM cell and thereby each subarray, bank, and vault in a DRAM die also contribute to the refresh time needed for a particular DRAM cell. DRAM cell variation can be both purely random (e.g., every DRAM cell is somewhat different) and parametric (e.g., DRAM cells near to one another perform similarly). Accordingly, even at similar temperatures, different storage locations in a DRAM need to be refreshed at different rates. However, according to conventional schemes, entire regions of DRAM are refreshed at a same rate.

DRAM cells of a row cannot be accessed while the row is being refreshed, so time spent refreshing DRAM cells can reduce overall performance of memory-accessing workloads. High DRAM cell density combined with DRAM cell retention-time variability results in DRAM refresh becoming a severe performance bottleneck under certain conditions. Complicating the situation, die or other layers of DRAM cells often are stacked together directly on top of each other to form a stacked DRAM, which in turn often is stacked on top of heat-generating logical components such as central processing units (CPUs) and graphics processing units (GPUs), thereby increasing refresh rates when decreased refresh rates are desired.

Conventional data placement within available DRAM cells is agnostic to variations in DRAM retention times thereby resulting in a sub-optimal data placement when considering certain operational characteristics of stacked DRAM and the character of the data therein. Different sections and different layers of stacked DRAM are exposed to different temperatures depending on a variety of factors including the particular geometry of the components and their respective heat-producing workloads, locations of heatsinks, amount of contact with other components, and the physical design of the DRAM layers and components therein.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Memory bandwidth in stacked DRAM or similar stacked volatile memory is a substantial factor in many product designs, from high-bandwidth graphic processor units (GPUs) to server central processor units (CPUs). Applications for machine learning, high-performance computing, cryptocurrency mining, and related high-growth domains significantly benefit from high memory bandwidth availability in computing devices and systems. Unfortunately, conventional refresh frequencies are fixed or left to a memory cell refresh controller that has a limited ability to control refresh rates. DRAM cells cannot be accessed during a refresh cycle. Thus, conventional approaches to stacked DRAM refresh mechanisms impair memory bandwidth.

Rather than using a single refresh rate and seemingly randomly placing data into certain locations or regions within one or more layers of the stacked DRAM, the techniques and systems described herein selectively place and maintain data in less-frequently-refreshed areas of memory. Selective placement is especially useful for data that are frequently accessed: certain data that are accessed at a substantively higher frequency than other data. Such data are referred to as high access rate data or data having a frequency of access that is relatively high compared to other data. In some embodiments, variable refresh rates are used within stacked DRAM regions. A stacked DRAM die may be pre-characterized to identify certain memory ranges that need to be refreshed at a first rate (e.g., once per X milliseconds (ms) at a particular temperature, while other ranges only need to be refreshed at a lower or second rate (e.g., once per Y ms) at the same temperature. The regions having a lower refresh rate are preferred regions for placing data that are frequently accessed. Data are thereby placed into certain stacked DRAM memory regions having lower refresh rates than other regions.

A memory refresh system as described herein monitors localized temperatures, and thereby localized refresh rates, within the stacked DRAM to understand and take advantage of a respective actual or required refresh rate of each region of memory. According to certain embodiments, DRAM retention time variations are exposed to a hardware component (e.g., a memory cache controller) or to a system software component (e.g., an operating system (OS) or a hypervisor). The hardware or software component performs a retention-aware data placement thereby improving memory access performance and reducing the chance for memory access collisions. Under this approach, refresh rate changes are detected, and data are moved to a new location based on the detected refresh rate changes.

Figure 1:
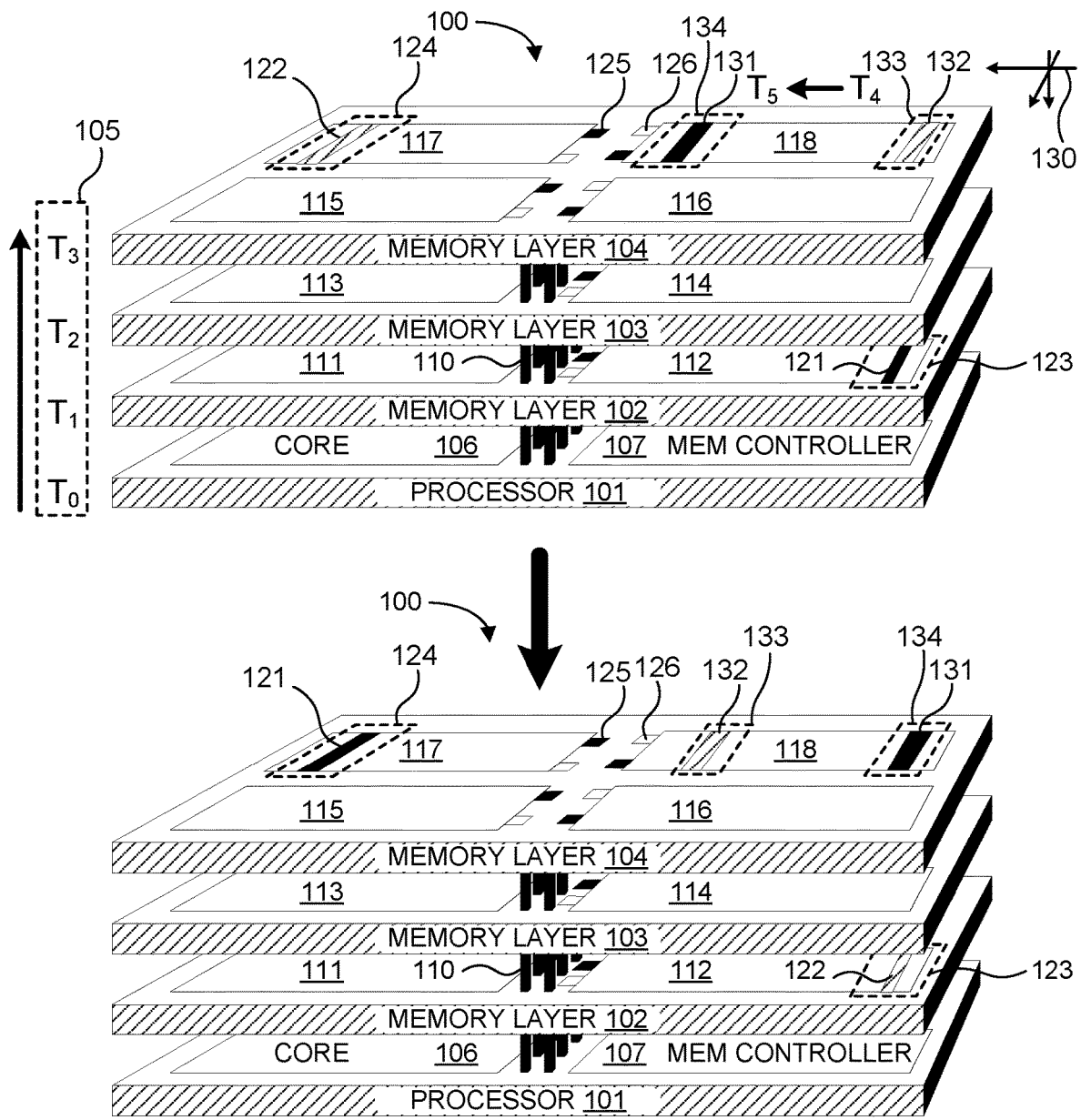
FIG. 1 is a block diagram of a stacked memory device in accordance with some embodiments.

FIG. 1 illustrates a stacked memory device 100 in accordance with some embodiments. The stacked memory device 100 includes a processor 101 on which a plurality of memory layers, such as the illustrated three memory layers 102-104, are stacked. Vias 110 and traces in and between the layers allow the various structures to address and to communicate with each other across the memory layers 102-104. The various layers are depicted as being physically separated from each other for sake of simplicity and to permit illustration of various components therein. The processor 101 includes one or more processor cores 106 for executing computing instructions or micro operations. While a single processor core 106 is illustrated, the processor 101 may instead implement multiple processor cores, including processor cores of different types. A memory controller 107 manages the various sections of the memory layers 102-104. Alternatively, each layer includes its own memory controller or memory sub-controller and operation of the respective memory sub-controllers is coordinated. Each memory layer 102-104 implements a DRAM architecture and includes a plurality of DRAM cells, each DRAM cell storing a bit of data.

The DRAM cells are divided into a plurality of regions, such as ranks, banks, arrays, sub-arrays, and the like. For example, the first memory layer 102 includes a first region 111 and a second region 112. The second memory layer 103 includes a first region 113 and a second region 114. The third memory layer 104 includes four regions: a first region 115, a second region 116, a third region 117, and a fourth region 118. According to some embodiments, each region 111-118 includes at least one thermal sensor 125 and at least one memory refresh module 126. According to certain embodiments, the memory controller 107 includes a plurality of vault controllers, each managing a sub-stack of memory regions within the stacked memory device 100. For example, the stacked memory device 100 may include a vault controller (not illustrated) which is configured to control a set of first regions 111, 113, 115 and data stored therein. For example, a first vault controller is configured to maintain data within the set of first regions 111, 113, 115 as further described herein.

In operation, each of the regions 111-118 or each of the memory layers 102-104 in the stacked memory device 100 is determined to be at a particular temperature $T_N$ 105 such as an average temperature, where "N" refers to the particular region 111-118 or particular memory layer 102-104. For example, the processor 101 is at a processor temperature $T_0$, the first memory layer 102 is at a first temperature $T_1$, the second memory layer 103 is at a second temperature $T_2$, and the third memory layer 104 is at a third temperature $T_3$. Alternatively, the first region 111 of the first memory layer 102 is at a first temperature $T_1$ at a first time or during a first interval, the first region 113 of the second memory layer 103 is at a second temperature $T_2$ at a first time or during a first interval, the first region 115 of the third memory layer 104 is at a third temperature $T_3$ at a first time or during a first interval, and so forth, layer by layer and region by region according to a density and availability of thermal sensors 125. Often, the temperatures from the processor 101 upward through the memory layers 102-104—$T_0$ through $T_3$—are individual temperatures along a temperature gradient from a high temperature to relatively low temperature as the memory device 100 releases energy in the form of heat to its surroundings. The temperatures of the particular regions within one layer can be substantially the same as one another, but such a situation is not always so. As understood by those in the art, temperatures at various points in the stacked memory device 100, when operating, typically vary along each of three dimensional axes 130 depending on the various heat-generating activities of the components in the memory device 100.

The memory controller 107 refreshes each of the DRAM cells, rank by rank, bank by bank, or region by region 111-118 via various memory refresh modules 126 based on a respective temperature $T_N$ 105 measured for the various regions 111-118 by the respective thermal sensors 125. A higher temperature is correlated with a faster refresh cycle needed to reliably maintain data in the various data bits in the regions 111-118. That is, according to some implementations, the memory refresh modules use a correlation between temperature and memory refresh rate when operating. According to certain embodiments, a refresh rate is set for each of the various regions 111-118 based on a respective temperature of each of the respective regions 111-118. Thus, the refresh rate for a given region 111-118 is periodically or otherwise dynamically updated as the various temperatures of these regions 111-118 change over time.

Not only are certain data initially placed in a preferred location based on temperature or refresh rate, data are moved to a different region during operation of the stacked memory device 100. The following is an example of moving data from one memory region to another. In the stacked memory device 100, first data 121 are stored in a first memory bank 123 of a second region 112 of the first memory layer 102. For purposes of example, the first memory bank 123 and second region 112 are determined to be at a first temperature $T_1$ at a particular time t. At this time, the first temperature $T_1$ is higher than a second temperature $T_2$, and the second temperature $T_2$ is higher than a third temperature $T_3$. For purposes of this example, the third temperature $T_3$ is a preferred temperature and preferred memory refresh rate in the stacked memory device 100. For sake of illustration of the techniques described herein, the third temperature $T_3$ is a lowest temperature in the stacked memory device 100 and corresponds to a preferred region to receive data moved from a hotter region. The first data 121 are moved to a second memory bank 124 of the third region 117 of the third memory layer 104.

In this example, a position of the second memory bank 124 is in a different location or region with respect to a first directional axis, a second directional axis, and a third directional axis in the stacked memory device 100. In certain embodiments, the first data 121 are moved along one, two, or three directional axes, depending on a configuration or logical programming of the memory controller 107. That is, in certain circumstances, it is required or beneficial to persist data in a same layer or region within the stacked memory device 100 but to a place of lower temperature and thereby lower memory cell refresh rate. According to certain embodiments of steps of operation, the first data 121 are first identified as highly accessed data prior to moving the first data 121 to a new region and a new memory bank that is cooler in temperature. That is, the first data 121 are moved when the first data 121 experience or begin to experience a high rate of access such as access by an operating system (OS) or computer program. According to certain embodiments, for faster operation, a per-layer data structure is maintained by the memory controller 107 for identifying locations or regions within the layers. Alternatively, a per-layer data structure is maintained as a separate structure in each of the memory layers 102-104 which includes locations for each of a set of available, unoccupied, or free memory pages or regions to which data may be moved. When triggered to move data, the per-layer data structure is accessed and a destination location is identified based on the references to free memory pages or regions therein.

In certain circumstances, movement to an unoccupied memory region is not possible, such as when the memory regions 111-118 are substantially filled with data. In such circumstances, the first data 121 are switched with second data 122 which are preferably data that are accessed less frequently or least frequently accessed as determined for each group of data presently stored in the stacked memory device 100. Generally, a hardware or software component operates to place certain data such as frequently-accessed data and data of certain cachelines into one or more memory regions that are refreshed at a relatively low rate, which corresponds to one or more memory regions that have a high data retention time. According to certain embodiments, in a system where a stacked memory device 100 is part of a main memory, an OS migrates the most frequently accessed data to memory regions with longer retention times. By placing the most frequently accessed data entities, either hardware-managed cachelines or software-managed memory pages, in a memory region with better retention times, the loads/stores issued by the processor 101 are interrupted less often by DRAM refresh commands of the memory controller 107. Moving at least some of the data to a new location or region results in increased memory bandwidth among improved performance metrics of the system.

FIG. 1 also illustrates moving data from one region to another region within a same memory layer in a stack of memory layers. In operation, and at certain times, each of the various sub-divisions of the memory layers 102-104 are at respective temperatures as measured by the thermal sensors 125. For example, a third memory bank 133 of the fourth region 118 is at a fourth temperature $T_4$ while a fourth memory bank 134 of the same fourth region 118 is at a fifth temperature $T_5$. In this example, the fourth temperature $T_4$ is higher than the fifth temperature $T_5$ and the values in the DRAM cells of the third memory bank 133 are refreshed at a higher rate (i.e., more frequently) than the values in the DRAM cells of the fourth memory bank 134 as determined by the memory controller 107.

At a certain point in time, the memory controller 107 is triggered to move third data 132 in the third memory bank 133 into the fourth memory bank 134 to take advantage of the slower refresh rate in the fourth memory bank 134 at the lower fifth temperature $T_5$. Such triggering of the memory controller 107 is performed by an operating system, by memory controller logic of the memory controller 107, or by another component. For example, in response to the third data 132 being determined to be frequently accessed data, the memory controller 107 identifies a set of free or available DRAM cells in the fourth memory bank or identifies a set of DRAM cells that could be swapped from the fourth memory bank 134 to the third memory bank 133 in the event that the fourth memory bank 134 is full. During an appropriate time period (e.g., when the processor 101 is in an idle state, a low activity state, or a low-power state), the memory controller 107 moves the third data 132 to the fourth memory bank 134, and, if making a swap, moves the fourth data 131 to the third memory bank 133. The memory controller 107 does so by copying the third data 132 and the fourth data 131 row by row, or region by region, as understood by those in the art. In this example, data are relocated along one of three dimensional axes 130 from a region of high temperature $T_4$ to a region of low temperature $T_5$.

Figure 2:
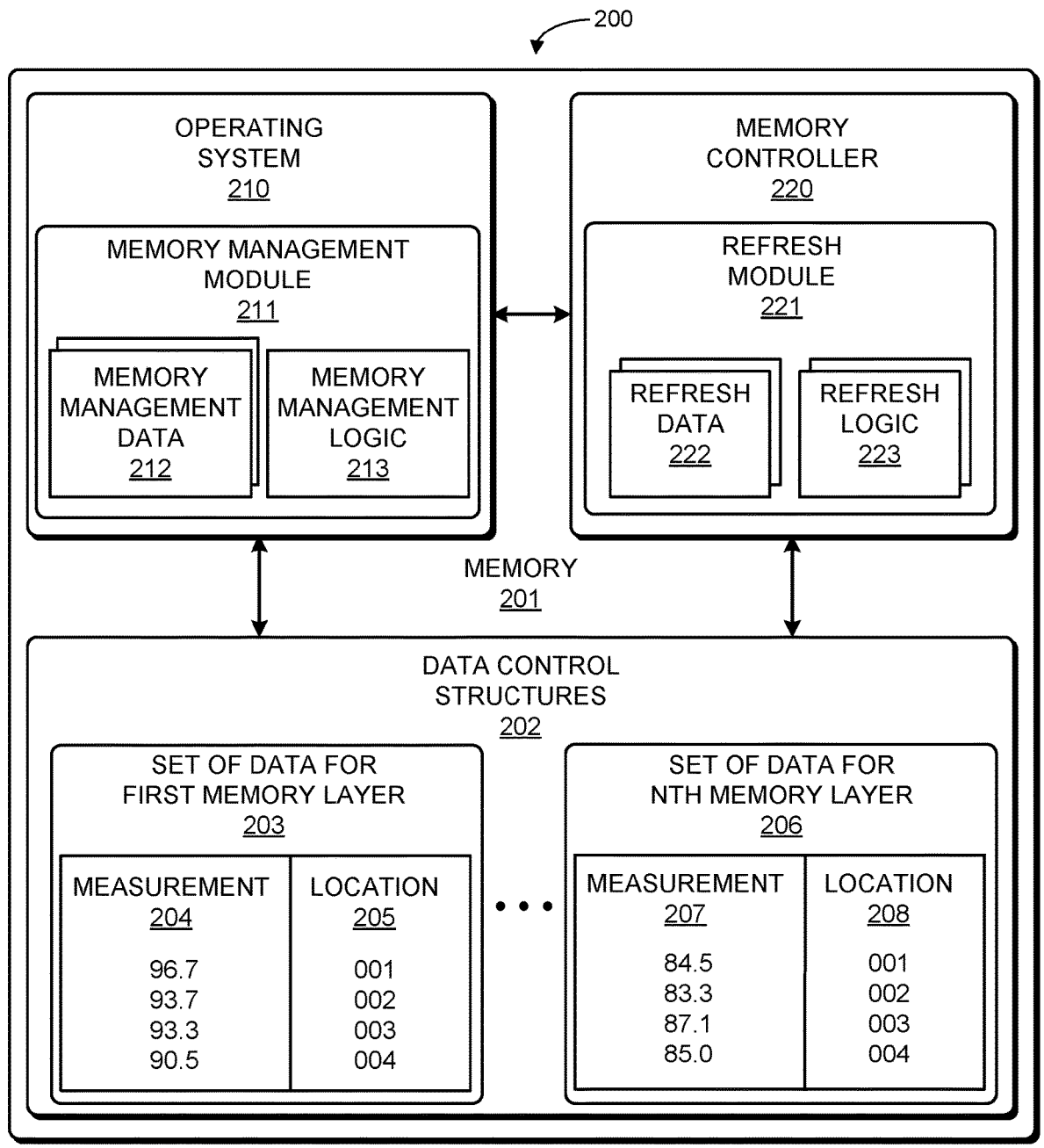
FIG. 2 is a block diagram of a memory structure in accordance with some embodiments.

FIG. 2 is a block diagram of a memory structure 200 as part of a computing system in accordance with some embodiments. The memory structure 200 is a two-dimensional representation of a stacked memory structure having multiple memory layers, such as the memory layers 102-104 of FIG. 1. The memory structure 200 includes a memory 201 having a memory controller 220 that manages memory layers, memory regions, and DRAM cells in the memory 201 including those of a set of stacked memory layers. The memory 201 also includes an operating system 210 stored therein, such as during runtime of the computing system. For sake of simplicity, memory regions, individual DRAM cells, and stacked memory layers are not shown.

The memory controller 220 includes one or more refresh modules 221. The refresh module 221 includes and operates refresh logic 223 to cycle and maintain data in the DRAM cells, such as the first data 121 of a first memory layer 102 of a stacked memory device 100 of FIG. 1. The refresh module 221 and the refresh logic 223 acquire and use refresh data 222 to schedule refreshing of the various memory banks and memory regions. According to certain embodiments and as described in greater detail below, the refresh data 222 include data representing a frequency of access of certain data stored in the various layers of stacked memory and a current refresh schedule or rate of refresh for the data managed by the memory controller 220. The current refresh rate may be a minimum required refresh rate or another refresh rate. The refresh data 222 are based on various measurement data and other data available in data control structures 202 about the various memory regions including those memory regions of stacked memory layers.

The data control structures 202 include a set of data for each of the layers of a stacked memory such as the layers 102-104 of FIG. 1. For example, a first set of data 203 corresponds to a first memory layer such as the first memory layer 102, and a Nth set of data 206 corresponds to an Nth or last memory layer, such as the third memory layer 104 of FIG. 1. Each set of data of the data control structures 202 includes, for example, a set of measurements 204, 207, which include, for example, a temperature from respective thermal sensors of and associated with various memory regions. As an example, the first measurements 204 illustrated in the first set of data 203 are temperatures of locations 205 in a first layer of a stacked memory, and the second measurements 207 illustrated in the Nth set of data 206 are temperatures of locations 208 in an Nth layer of a stacked memory. In other embodiments, measurement data include values for one or a combination of voltages, currents, refresh rates, or the like taken from the various locations 205, 208 in the memory layers. While location is described with respect to the data control structures 202, location can refer to or be associated with a region within the memory structure.

The measurement data are correlated with various available and actual refresh rates or schedules for maintaining data in DRAM cells of memory layers, such as layers of stacked DRAM. The refresh module 221 accesses the data of the sets of data 203, 206 about the memory layers by communicating with the data control structures 202. According to certain embodiments, the data of the sets of data 203, 206 about the layers are stored in a central location. In other embodiments, the data of the sets of data 203, 206 are stored in individual structures in each layer of stacked memory.

In operation, the memory controller 220 implements movement of data from one region to another region, such as moving user data or operating system data (e.g., the first data 121, the second data 122), according to certain embodiments. In other embodiments, the operating system 210 performs the movement by directing the memory controller 220 to make the data movement. According to some embodiments, the operating system 210 includes a memory management module 211. The memory management module 211 includes, or has access to, memory management data 212 obtained from, or derived from, the data of the data control structures 202. For example, the memory management data 212 are derived from the various stacked memory layers from the measurements 204, 207 and the location data 205, 208 of the various memory layers 1-N. Memory management logic 213 of the memory management module 211 keeps track of, for example, data access frequencies and temperatures or refresh rates at the various locations throughout the stacked memory layers.

When the memory management logic 213 decides to move data, the memory management module 211 communicates with the memory controller 220 to move certain data to a new location based on a new temperature, a new refresh rate, or a new access frequency. For example, when a region of memory includes frequently accessed data, and the particular region exceeds a threshold temperature thereby raising a memory refresh rate, the memory controller 220 is programmed to move data identified as highly accessed to a new location such as at a location with a lowest temperature. According to at least some embodiments, the threshold temperature is a pre-determined value. Alternatively, movement of data is performed when there is a detected or determined change over time to one or more of the following variables: temperature of a memory region, a refresh rate of the memory region, and an access frequency of the memory region.

The following example is illustrative of the operation of the memory structure and data placement. Highly accessed data remain highly accessed by one or more processes of the operating system 210. The memory management logic 213 thus determines that an improvement to an overall memory bandwidth usage can be obtained by moving first data to a new memory region within a stacked memory that is a lower temperature region in a same or in a different memory layer of a plurality of stacked memory layers. At a time determined by the memory management logic 213, the memory management module 211 communicates with the memory controller 220, which in turn effectuates the data movement. As needed, the data movement involves two data movements: making room in a lower temperature memory region by first moving second data from the lower temperature memory region and replacing the second data with first and highly-accessed data. The second data are placed in the first location where the first and highly-accessed data were previously located, or alternatively may be moved to a third location. By swapping the two batches of data, the operating system lowers the frequency at which first and highly-accessed data are refreshed in stacked DRAM cells because the new location is in an area of the stacked memory that is at a lower temperature. In summary, data may be moved and managed within a memory structure by one or more hardware components, by one or more components of an OS, or a combination of hardware components and components of the OS.

Figure 3:
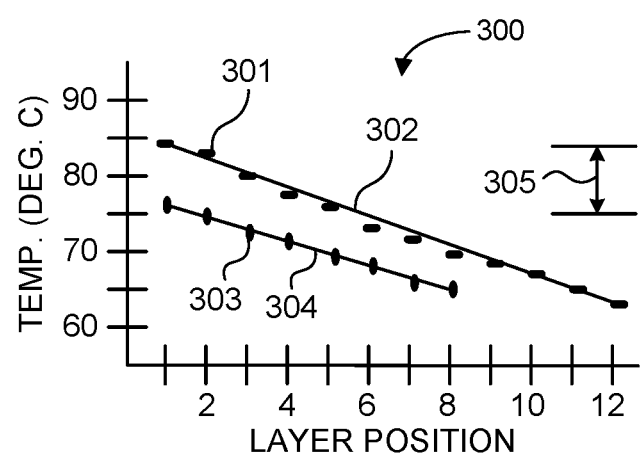
FIG. 3 is a diagram of an example of two sets of temperature data plotted against position of memory layers of two stacked memory devices.

FIG. 3 illustrates an example chart 300 of two sets of temperature data plotted against position of memory layers of two stacked DRAM memory devices. The chart 300 includes a first set of temperature data points 301 for a first stacked memory device having eight memory layers stacked on top of one another. A first line 302 is fitted to the first set of temperature data points 301. The chart 300 also includes a second set of temperature data points 303 for a second stacked memory device having twelve memory layers stacked on top of one another. A second line 304 is fitted to the second set of temperature data points 303. The x-axis is marked with layer position for the data points 301, 303 from a base of the respective first and second devices to their respective tops or lids. The y-axis is marked with a maximally observed temperature of each layer in degrees Celsius (deg. C.). A maximum difference 305 of approximately eight deg. C. is observed between a temperature of the respective first memory layers of the first device and the second device. On average, there is a temperature difference of approximately 1.65 deg. C. for the first eight-layer device and a temperature difference of approximately 1.55 deg. C. for the second twelve-layer device. With each of the first device and second device, a plurality of DRAM memory refresh rates are correlated to a respective temperature threshold or temperature range.

Figure 4:
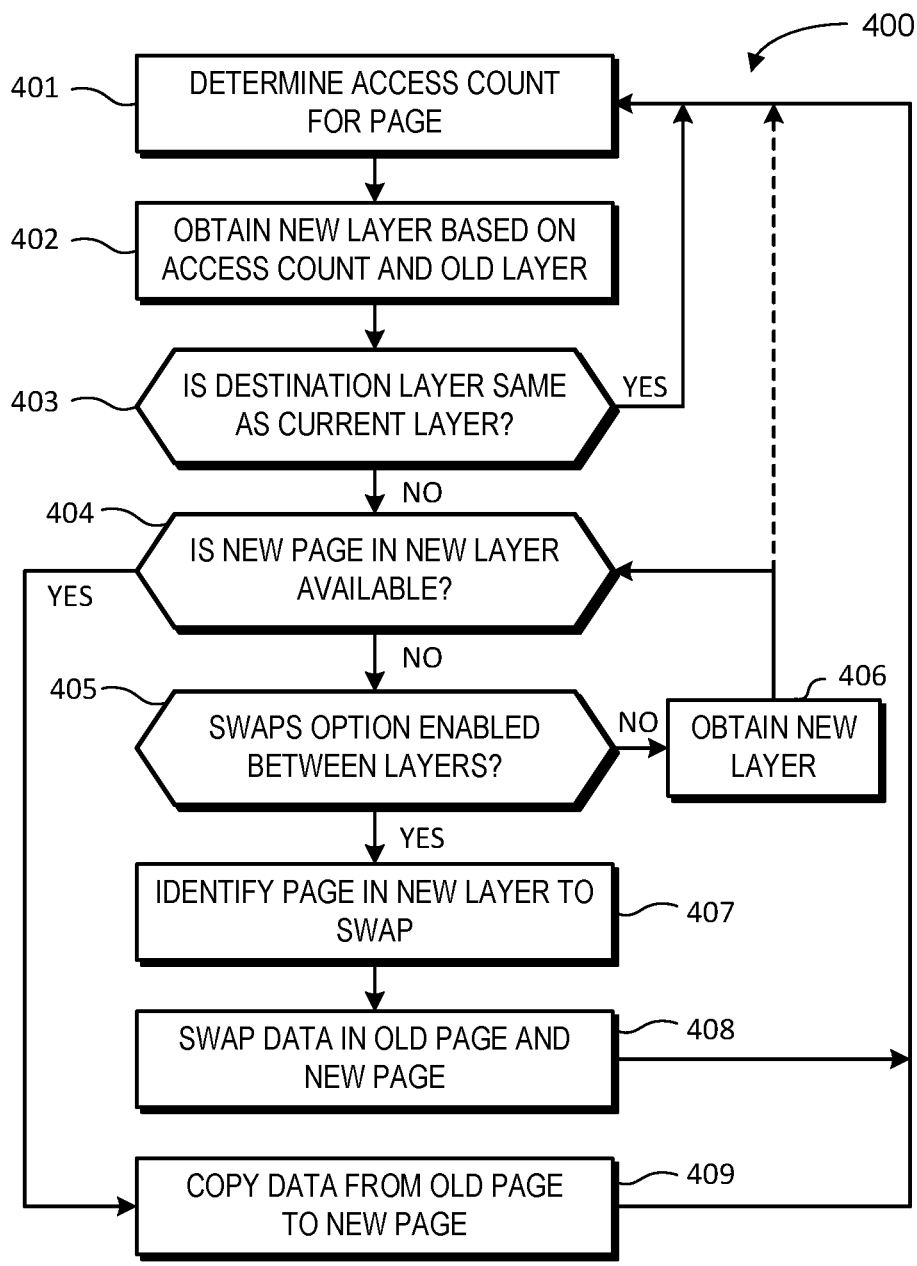
FIG. 4 is a flow diagram illustrating a method for managing data in a stacked memory device in accordance with some embodiments.

FIG. 4 illustrates a method 400 for managing certain data units in a stacked memory device in accordance with some embodiments. For example, the memory device is a stacked DRAM device such as the stacked memory device 100 of FIG. 1. The data units managed by the method 400 belong to a list or other identified group, such as certain data units that are frequently accessed by one or more processes of an OS. The processes of the method 400 are repeated for each data unit being managed. Further, the method 400 is based on an assumption that for each iteration of the method 400, each managed data unit may remain in a certain location or may be moved to an improved location in the stacked memory device depending on currently existing conditions in the particular stacked memory device.

For purposes of illustration, a data unit is identified as a page, pointed to by a page table of the OS, and its underlying physical address, physical address range, or physical addresses when describing the method 400. However, in other embodiments, the data unit may be bigger than, or smaller than, a page. A page can be stored in one or more locations such as a memory bank, memory rank, or memory layer in a multi-layer stacked memory device.

At block 401, an OS or memory controller (e.g., memory controller 107, FIG. 1) determines an access count for the data unit since a last refresh cycle. According to some embodiments, the access count is a current access count. According to other embodiments, an access count corresponds to a number of data refreshes or cycles since a last access to a particular data page.

At block 402, the OS or the memory controller obtains a new layer for the data page based on an access count and based on a current layer or an old layer of the data page (i.e., layer identity). In some embodiments, if the access count or access rate (i.e., the metric as the basis for moving the data unit) does not exceed an access count, an access threshold, an access threshold value, or a threshold difference, then no new layer is identified. Obtaining a new layer at block 402 includes comparing, by the OS or the memory controller, the access count or access count rate per unit time of the current layer against those of available layers and identifying a more suitable new layer in the stacked memory device. According to at least some embodiments, the OS or the memory controller adjusts a threshold value over time depending on a temperature difference or other difference between metrics of the respective layers. For example, if the temperature difference between layers narrows from 2.5 deg. C. at a first time to 2.1 deg. C. at a second time, the threshold value or threshold difference for triggering movement of data is increased so that a decision to move data occurs less often because the benefit of moving the data is decreased. This change to the threshold value compensates for a reduced benefit of moving data to a cooler layer when a temperature benefit decreases and a temperature gradient narrows, and thereby compensates for the memory refresh cycle rate benefit decreasing from the first time to the second time. In this example, when a refresh rate difference at 2.5 deg. C. is 10%, and the refresh rate difference at 2.1 deg. C. is 6%, then raising the threshold value before moving data to the new layer compensates for the decrease in the memory cell refresh rate at the second time. In operation, the threshold values, refresh rates, and so forth may be dynamically adjusted, determined, or calculated such as by the OS or the memory controller, or may be fixed pre-determined values consistent with design parameters and initial configurations.

Generally, the new layer is cooler in temperature than the current layer corresponding to a lower rate of memory cell data refreshing than the current layer. Therefore, according to certain embodiments, moving data to a new layer by the OS or the memory controller also includes identifying refresh rates or temperatures such as through sampling refresh rates over time or sampling temperatures over time of various regions in the stacked memory to keep the OS, the memory controller, or both the OS and the memory controller apprised of available locations (e.g., available layers, available memory cells) to which to move data. Depending on the particular components of the regions and available metrics therefrom, a temperature may be obtained through a calculation based on a correlation between temperature memory refresh rate, and vice versa. Such can be done by sampling a voltage or a current value of a component, and correlating the sampled voltage or current value with either a temperature or a memory cell refresh rate. The sampling can be performed by either the OS, the memory controller, or some other component. Correlating includes selecting a value from a data structure having a plurality of values. Correlating also includes calculating a value based on a formula or equation using values available in the system, stored in a data structure in memory, or combination thereof.

At block 403, the OS or the memory controller compares the newly obtained or identified layer and the current layer. If the new layer is the same as the current layer for the data unit, the cycle method 400 does nothing for the particular data unit. The method 400 is repeated for each of the managed data units. Once complete for a particular cycle, the method 400 includes waiting for a top of a next cycle as the method 400 is in operation as long as certain data units are managed by the OS, the memory controller, or a combination of software and hardware components.

When there is a newly identified destination layer for a particular data unit, the method 400 continues. At block 404, the OS or the memory controller determines whether there is a new page available in the newly identified layer. If so, at block 409, the data of the data unit are physically copied, by the OS or the memory controller, from the location or locations in the current memory layer to the new location or locations in the new layer, and the entry in the page table is updated to reflect the new physical location or locations in the new layer.

When there is not a new page available in the newly identified layer, the method 400 continues to block 405, whereupon the OS or the memory controller determines one of at least two alternative actions that can be performed. At block 405, the OS or the memory controller determines whether the system (e.g., hardware, firmware, boot-sequence, OS) is configured for swaps between layers or between the two particular layers at issue. For example, in the case of an OS variation, the OS checks whether swaps between layers are enabled. Such an option can be set or changed through a system control (sysctl) interface. If swaps are not enabled, at block 406, the method 400 continues by having the OS or the memory controller obtain or identify a new layer and looping back to, for example, the process at block 404 and determining whether a new page in the newly identified layer is available. If there are no more layers to consider, or if the swaps between layers option is not enabled at block 405, the method 400 ends. Alternatively, if the swaps between layers option is not enabled at block 405 for a particular layer, the method 400 passes from block 406 and back to block 401 for a next iteration. For block 406, obtaining the new layer includes the same or similar processes as described above when first identifying a new layer.

When swaps are enabled at block 405, the method 400 continues to block 407 et seq., which represent a second alternative action including swapping out data in the new layer to make room for the data to be moved, the data being managed by the managed data unit under consideration. At block 407, this second alternative includes the OS or the memory controller identifying a page and underlying data in the new layer to swap out, and, at block 408, the OS or the memory controller swapping the data of the newly identified page with the data of the managed data unit destined for the new layer. By way of example, the swap is performed by triggering a swap operation performed by a memory controller such as the memory controller 107 of FIG. 1 or the memory controller 220 of FIG. 2. Once the managed data unit has been swapped at block 408, the method 400 is repeated for the next managed data unit.

To implement the method 400, an OS, a hypervisor, a memory controller, or a combination thereof, maintains and uses certain data structures for making comparisons and performing logic functions as known to those in the art. According to certain embodiments, a refresh rate to maintain data within the DRAM cells of a stacked memory device is unrelated to a rate of performing the method 400 or a memory temperature optimization rate. The method 400 is performed on a periodic basis according to an update frequency determined by the OS or set by configuring one or more parameters in the OS, the hardware, the firmware, or other component in a system. Alternatively, the method 400 is performed based on certain temperature events such as detecting a threshold change in one or more layers or one or more locations or regions within the stacked memory device.

According to some embodiments, the method 400 is performed based on an optimization scheme as follows. A new location, a new region, or a new layer is identified by optimizing or increasing an overall memory bandwidth by solving the following mathematical formulation:

$$\text{Maximize}_A \sum_{i=0}^{N-1} BW_i \text{ subject to } \sum_{i=0}^{N-1} \alpha_{i,j} = 1 \qquad (1)$$

Moving the data of a data unit between two locations could incur performance penalties so just moving all data to a cooler memory region is not necessarily improving memory access in all situations and in all conditions. For example, if a first memory region or area has a data access rate $A_1$ such that the memory bandwidth is saturated, moving all the data from a first location to a second location does not improve the net memory bandwidth of the stacked memory device. Instead, moving only a portion of the data of the data unit (or one data unit instead of all managed data units) from the first location to the second location (e.g., memory bank, memory layer, memory region associated with a particular refresh rate or temperature) can more optimally exploit the bandwidth of both memory locations thereby improving memory bandwidth performance of the stacked memory device. Accordingly, optimization of memory bandwidth use is performed by the OS or the memory controller according to the equation (1) above where N is the total number of layers of the stacked memory device, and $A=\{\alpha_{ij}|i,j=\{0, 1, 2, \ldots, N-1\}\}$ is an N×N matrix. A memory use bandwidth ($BW_i$) per layer is given by:

$$BW_i = \sum_{i=0}^{N-1} \alpha_{i,j} n_j \quad (2)$$

where $n_j$ is a number of memory access requests going to layer j beyond a given threshold and $\alpha_{ij}$ is a fraction of requests from layer j mapped to layer i. The solution is $\alpha^*_{ij}$, an optimal distribution of requests that maximizes the memory bandwidth for the entire stacked memory device.

In some embodiments, the apparatus and techniques described above are implemented in a system including one or more integrated circuit (IC) devices (also referred to as integrated circuit packages or microchips), such as the stacked memory devices having DRAM cells described above with reference to FIGS. 1-4. Electronic design automation (EDA) and computer aided design (CAD) software tools may be used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments and DRAM cells. However, one of ordinary skill in the art appreciates that various modifications and changes can be made without departing from the scope of the present disclosure as set forth in the claims below including an understanding that while DRAM cells are referenced, the disclosure is applicable to any memory cell that benefits from or requires a refresh operation. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   monitoring a first memory refresh rate of a first memory die, the first memory die being in a first memory stack; and
   responsive to a change in the first memory refresh rate exceeding a first threshold, and responsive to identifying free memory at a second memory die of the first memory stack, moving at least a portion of a data unit from the first memory die to the second memory die based on a bandwidth of the first memory die or a bandwidth of the second memory die, wherein the portion of the data unit is less than an entire data unit.

2. The method of claim 1, wherein monitoring the first memory refresh rate includes sampling a temperature of the first memory stack.

3. The method of claim 1, further comprising:
identifying the change in the first memory refresh rate, wherein identifying the change in the first memory refresh rate comprises identifying a current refresh rate based on a correlation between a first temperature and the first memory refresh rate.

4. The method of claim 1, wherein:
the first memory die is in the first memory stack with a third memory die and having a first temperature; and
the second memory die is in a second memory stack with a fourth memory die and having a second temperature different than the first temperature.

5. The method of claim 4, further comprising:
maintaining a data structure at one of the first, second, third, and fourth memory dies, the data structure identifying the free memory at the second memory die.

6. The method of claim 5, wherein the third memory die is different from the fourth memory die.

7. The method of claim 5, wherein the third memory die is the same as the fourth memory die.

8. The method of claim 5, wherein the data structure is maintained at the second memory die.

9. The method of claim 5, wherein the data structure is maintained at the fourth memory die.

10. A method, comprising:
in response to identifying a change in a memory refresh rate at a first memory die of a first memory stack, moving at least a portion of a data unit from the first memory die to a second memory die of a second memory stack based on a bandwidth of the first memory die or a bandwidth of the second memory die, wherein the portion of the data unit is less than an entire data unit; and
maintaining a data structure at one of the first and second memory stacks, the data structure identifying at least free memory in the first and second memory stacks, wherein moving comprises moving data from the first memory die to the second memory die based on said free memory.

11. The method of claim 10, wherein the first memory stack comprises a first plurality of memory dies and the second memory stack comprises a second plurality of memory dies different from the second plurality of memory dies.

12. The method of claim 10, wherein the first memory stack and the second memory stack together form a third memory stack.

13. The method of claim 10, wherein the first memory stack and the second memory stack each form-separate memory stacks.

14. A device comprising:
a first memory stack comprising a first memory die and a second memory die; and
a memory management module to:
monitor a first memory refresh rate of the first memory die; and
responsive to a change in the first memory refresh rate exceeding a first threshold, and responsive to identifying free memory at a second memory die of the first memory stack, moving at least a portion of a data unit from the first memory die to the second memory die based on a bandwidth of the first memory die or a bandwidth of the second memory die, wherein the portion of the data unit is less than an entire data unit.

15. The device of claim 14, wherein the memory management module is to monitor the first memory refresh rate by sampling a temperature of the first memory stack.

16. The device of claim 14, wherein the memory management module is to identify the change in the first memory refresh rate by:
identifying a current refresh rate based on a correlation between a first temperature and the first memory refresh rate.

17. The device of claim 14, wherein:
the first memory die is in the first memory stack with a third memory die and having a first temperature; and
the second memory die is in a second memory stack with a fourth memory die and having a second temperature different than the first temperature.

18. The device of claim 17 wherein the memory management module is to:
maintain a data structure at one of the first, second, third, and fourth memory dies, the data structure identifying the free memory at the second memory die.

19. The device of claim 18, wherein the third memory die is different from the fourth memory die.

20. The device of claim 18, wherein the third memory die is the same as the fourth memory die.

21. The method of claim 1, further comprising:
responsive to the change in the first memory refresh rate exceeding the first threshold and responsive to identifying no free memory is available at the second memory die, swapping the data unit from the first memory die with a second data unit from the second memory die.

* * * * *